United States Patent [19]

Koch et al.

[11] Patent Number: 5,061,602
[45] Date of Patent: Oct. 29, 1991

[54] PHOTOSENSITIVE RECORDING MATERIAL OF ENHANCED FLEXIBILITY

[75] Inventors: Horst Koch, Gruenstadt; Hans Schupp, Worms; Reinhold Schwalm, Wachenheim, all of Fed. Rep. of Germany

[73] Assignee: BASF Aktiengesellschaft, Ludwigshafen, Fed. Rep. of Germany

[21] Appl. No.: 384,909

[22] Filed: Jul. 25, 1989

Related U.S. Application Data

[63] Continuation of Ser. No. 155,499, Feb. 12, 1988, abandoned.

[30] Foreign Application Priority Data

Feb. 28, 1987 [DE] Fed. Rep. of Germany ....... 3706561

[51] Int. Cl.$^5$ .............................................. G03F 7/033
[52] U.S. Cl. .................................... 430/281; 430/288; 430/910; 430/907; 430/909; 522/114; 522/117; 522/121; 522/147; 522/145; 522/149; 522/137
[58] Field of Search ............... 430/909, 907, 281, 288, 430/910; 522/114, 117, 121, 137, 147, 145, 149

[56] References Cited

U.S. PATENT DOCUMENTS

| | | |
|---|---|---|
| 3,036,914 | 5/1962 | Jennings . |
| 3,469,982 | 9/1969 | Celeste . |
| 3,751,259 | 8/1973 | Bauer et al. .................... 96/115 P |
| 3,786,116 | 1/1974 | Milkovich et al. ................. 260/885 |
| 3,887,450 | 6/1975 | Gilano et al. ........................ 430/281 |
| B1 3,953,309 | 4/1983 | Gilano et al. . |
| 3,953,309 | 4/1976 | Gilano et al. . |
| 4,234,675 | 11/1980 | Kuznetsov . |
| 4,239,849 | 12/1980 | Lipson et al. . |
| 4,454,219 | 6/1984 | Yamadera et al. . |
| 4,688,056 | 8/1987 | Noguchi ......................... 522/149 X |
| 4,722,885 | 2/1988 | Yokoyama et al. ............. 430/548 X |
| 4,849,307 | 7/1989 | Hoffmann et al. .................. 522/121 |

FOREIGN PATENT DOCUMENTS 0049504 4/1982 European Pat. Off. .
0128014 12/1984 European Pat. Off. .

OTHER PUBLICATIONS

G. O. Schulz, R. Milkovich: J. of Applied Polymer Science, 27, 4773 (1982).
J. P. Kennedy, Rubber Chem. & Technology 56, p. 639 (1983).
P. Rempp, E. Franta: Advances in Polymer Science, 58, pp. 1-50 (1984).
G. O. Schulz, R. Milkovich: J. of Polymer Science, Polym. Chem. Ed. 22, 1633 (1984).

*Primary Examiner*—Cynthia Hamilton
*Attorney, Agent, or Firm*—Keil & Weinkauf

[57] ABSTRACT

In a photosensitive recording material suitable for producing plates or resist patterns, the photopolymerizable recording layer contains as polymeric binder a film-forming copolymer which has a multiphase morphology, one phase having a glass transistion temperature below room temperature and a further phase having a glass transition temperature above room temperature and this copolymer having been obtained by free radical copolymerization of one or more macromers with one or more further olefinically unsaturated copolymerizable organic compounds.

7 Claims, No Drawings

PHOTOSENSITIVE RECORDING MATERIAL OF ENHANCED FLEXIBILITY

This application is a continuation of application Ser. No. 155,499, filed on Feb. 12, 1988, now abandoned.

The present invention relates to a photosensitive recording material which contains a photopolymerizable recording layer containing a polymeric binder and applied to a base material and which is suitable in particular for producing printing plates or resist patterns. More particularly, the present invention relates to a recording layer which produces a product which is suitable for use as a flexible photopolymerizable film.

The existing photosensitive recording elements which are strippable with aqueous alkaline or organic developer solutions and used for producing photopolymeric printing plates or resist patterns contain, on a dimensionally stable base material, for example on a plastics film or a sheet of metal, a photopolymerizable recording layer which comprises in general a mixture of one or more polymeric binders soluble or dispersible in the aqueous alkaline or organic developer solutions, one or more ethylenically unsaturated, photopolymerizable, low-molecular weight compounds, one or more photoinitiators and, if desired, further additive and/or auxiliary substances which improve and/or modify the processing and/or application properties.

The polymeric binders used for photopolymerizable recording layers which are developable with aqueous alkali are here in particular carboxylic acid or anhydride group containing copolymers which is soluble or at least dispersible in the aqueous alkaline developer solutions, for example styrene/maleic anhydride copolymers, styrene/ monomaleate copolymers, alkyl (meth)acrylate/(meth)acrylic acid copolymers or even copolymers of styrene, alkyl (meth)acrylates and (meth)acrylic acid, with or without further comonomers (cf. inter alia DE-B-2,027,467, SU Patent 190,211, DE-A-2,205,146, EP-A-49,504 or DE-A-2,736,058).

Binders which are used in organically developable photopolymerizable recording layers consist predominantly of polymers or copolymers of styrene and/or (meth)acrylate containing monomers. Copolymers of this type are described for example in U.S. Pat. No. 3,469,982, DE-A-3,215,513 or DE-A-3,131,448.

It is true that layers of these binders are soluble or dispersible in aqueous alkaline or organic developer solutions, but in the exposed, i.e. crosslinked, state they show a high brittleness and poor adhesion to the base material. A brittle film can break in use. If such a layer is used for example as an etch or electroplating resist in the production of printed circuits, the etch or electroplating solutions can penetrate in those areas where the resist has cracked and attack the metal layer underneath in such a way that the entire circuit becomes unusable. This danger of breaking or cracking exists in particular in the case of flexible circuit boards where the base material is only a thin, flexible plastics film. The brittleness is also a particular disadvantage in relation to their use as a soldering mask. Such a mask is applied to the circuit board before soldering to protect the conducting paths underneath from the hot soldering lacquer at 250° C. Furthermore, the soldering mask has to be stable to solvents and chemicals and have very good electric properties such as a high volume resistance, a high breakdown resistance and a low dielectric constant, since, in general, the mask stays on the circuit and acts as a permanent protective insulating layer. If dry film resists are used as soldering masks, a high brittleness is especially troublesome, since cracks can lead to the ingress of moisture and the like, which can corrode the circuit or lead to tracking currents. Moreover, on cutting a circuit board coated with a soldering resist, splintering at the edges so that parts of the copper underneath are bared is a constant problem. A brittle film can therefore not be used for applications where flexible circuits are required; its use as a soldering resist would entail serious disadvantages.

In the prior art, external plasticizers are incorporated in the photopolymerizable material in order that the poor flexibility may be overcome. However, this is not completely satisfactory since such plasticizers, on aging, tend to migrate within the film and help to make cold flow worse. Cold flow cannot be tolerated since the rolls of film are stored under a static load, and after a short time the photopolymerizable material begins to seep out from between the layers. The material then begins to melt along the edges of the rolls and makes it difficult, if not indeed impossible, to unroll the film material evenly and without destroying the layer structure of the film. In addition, many plasticizers are volatile. During the production of the film, some of the plasticizer evaporates if drying is not carefully controlled, returning the film back into its brittle state.

U.S. Pat. No. 3,036,914 describes a photopolymerizable composition of enhanced flexibility which consists of an ethylenically unsaturated compound, such as diacrylates or (meth)acrylic esters of polyalkylene glycols, a photoinitiator, a high molecular weight polyethylene oxide and one or more linear cellulose esters. U.S. Pat. Nos. 3,887,450 and 3,953,309 describe a photopolymerizable composition which can be developed in an aqueous alkaline solution and which is stable in the form of a flexible film on a roll. This layer consists of a photopolymerizable ethylenically unsaturated monomer, a photoinitiator, a polymerization inhibitor and a binder composed of one or more styrene or vinyl monomers and one or more $\alpha,\beta$-ethylenically unsaturated acid or anhydride monomers. A further advance in the art is disclosed in U.S. Pat. No. 4,239,849, which describes a flexible layer which is stable to cold flow on a roll and can be developed with aqueous alkali. This composition consists of one or more monomers, a photoinitiator and a polymeric binder comprising a copolymer of a styrene monomer, an acrylic monomer and an unsaturated carboxyl-containing monomer.

A layer of enhanced flexibility is also described in EP 128,014. Here the photopolymerizable composition consists of one or more (meth)acrylic esters, a photoinitiator, a polymerization inhibitor and a binder from a styrene monomer, an acrylic monomer and a monomer which contains unsaturated acid or anhydride groups. Such a layer is also described in DE-A-2,602,410.

It is true that in the unexposed state all these layers are flexible and stable on the roll, but after exposure they all still show high brittleness and reduced adhesion to the base substrate. If in particular the crosslinking density is increased to such an extent that the layer shows the heat and chemical resistance required for use as a soldering mask, in every case the material is so sensitive that, on flexing the circuit, the material breaks and spalls in fragments off the base material.

It is an object of the present invention to develop photopolymerizable layers which, in the unexposed state are stable in roll form and are not prone to cold flow, but in the exposed and crosslinked state are still sufficiently flexible, show good adhesion to the base materials and do not break on mechanical deformation.

We have found that this object is achieved, surprisingly, with photosensitive recording elements incorporating a photopolymerizable recording layer which has been applied to a dimensionally stable base material and is developable with aqueous alkali or organic developer solutions if the photopolymerizable recording layer contains as a polymeric binder one or more film-forming copolymers which, in the form of a comb polymer, is constructed from suitable (meth)acrylate monomers and/or styrene monomers and also from further monomers in such a way that it has a multiphase morphology.

The present invention accordingly provides a photosensitive recording material which is suitable for producing a printing plate or a resist pattern and incorporates a photopolymerizable recording layer which has been applied to a dimensionally stable base material, is developable with aqueous alkali or with organic solvents, and which contains a polymeric binder which is soluble or dispersible in aqueous alkaline media or in organic solvents, one or more low molecular weight ethylenically unsaturated photopolymerizable organic compounds and one or more photopolymerization initiators with or without further additive and/or auxiliary substances, wherein the polymeric binder comprises one or more film-forming copolymers which have a multiphase morphology with one or more phases having a glass transition temperature below room temperature and one or more further phases having a glass transition temperature above room temperature, this or these copolymers having been obtained by free radical copolymerization of one or more macromers with one or more further olefnically unsaturated copolymerizable organic compounds.

Preferably the polymeric binder comprises a film-forming copolymer having a two-phase morphology and an average molecular weight (weight average) of over 10,000. It is also preferable to use for the copolymer used as the polymeric binder a macromer having an average molecular weight (weight average) from 1,000 to 100,000 and that in the multiphase morphology copolymer used as polymeric binder the continuous phase have a glass transition temperature below room temperature and the dispersed phase have a glass transition temperature above room temperature.

By using the specified copolymers as polymeric binders in photopolymerizable recording layers the invention provides photosensitive recording elements having advantageous, partly surprisingly improved, properties. For instance, on storage in roll form the photosensitive recording elements have no tendency toward cold flow and, after exposure to actinic light, are still sufficiently flexible to be suitable for use as resists for thin, flexible circuits. In particular, the recording materials according to the invention, after complete curing as required for use as a soldering mask, show good adhesion to the base substrate and high flexibility.

In what follows, the structural components of the recording materials according to the invention will be discussed in detail.

The polymeric binders which are present according to the invention in the photopolymerizable recording layer of the photosensitive recording elements comprise specific copolymers which are soluble or at least dispersible in aqueous alkaline or organic solvents. The copolymers to be used according to the invention shall be film-forming and in general they have an average molecular weight (weight average) greater than 10,000, preferably within the range from about 15,000 to about 500,000, in particular within the range from about 20,000 to about 250,000.

The copolymers to be used according to the invention are constructed from a plurality of comonomers, of which at least one monomer is a compound having a molecular weight from 1,000 to 100,000, preferably from 3,000 to 20,000, and has only one polymerizable group. Such macromolecular monomers are in general also referred to as macromers and have long been disclosed in the literature. Reference is made here for example to the review articles by P. Rempp, Plaste Kautschuk 28 (1981), 365, G. O. Schulz, R. Milkovich, J. Appl. Polym. Sci. 27 (1982), 4773, J. P. Kennedy, Rubber Chem. Technol. 56 (1983), 639 and P. Rempp, E. Franta, Advan. Polym. Sci. 58 (1984), 1.

Even multiphase copolymers with these macromolecular monomers have been described before, for example in G. O. Schulz, R. Milkovich, J. Polym. Sci., Polym. Chem. Ed. 22 (1984), 1633, and in U.S. Pat. No. 3,786,116.

In particular for the use in resists the nature and amount of the comonomers will be chosen in such a way that the first phase of the multiphase copolymer have a glass transition temperature below room temperature and the second phase have a glass transition temperature above room temperature. Preferably, it will be the continuous phase which has a low (<room temperature) glass transition temperature, preferably below 10° C., and the dispersed phase which will have a high glass transition temperature (>room temperature), preferably above 40° C. The proportion of macromolecular monomer (=macromer) is in general within the range from 5% by weight to 70% by weight, preferably from 10 to 40% by weight, of the total amount of monomer used for preparing the copolymer.

Suitable macromers are customary short-chain polymers having a polymerizable double bond at the end of the chain. Examples of macromers which have proved particularly advantageous for use in polymeric binders are polystyrene monoacrylates and monomethacrylates having molecular weights from 3,000 to 20,000, copolymers of styrene and methacrylic acid which have a (meth)acrylic end group, copolymers of methyl methacrylate and (meth)acrylic acid which have a vinylically unsaturated end group, and poly(2,6-dimethyl)-phenylene oxide mono(meth)acrylates.

The film-forming copolymers to be used according to the invention as polymeric binders can be prepared in a conventional manner by free radical copolymerization of the macromers with other comonomers, for example in solution.

Suitable comonomers for copolymerization with the macromers are the customary copolymerizable ethylenically unsaturated organic compounds, in particular those of low molecular weight, such as aromatic vinyl compounds, for example styrene, substituted styrenes which are substituted in the side chain or in the ring, for example by alkyl or halogen, such as α-methylstyrene and p-methylstyrene, the esters of acrylic acid and methacrylic acid with $C_1$-$C_8$-monoalcohols, in particular the acrylates and methacrylates of straight-chain or branched mono- or dialcohols, preferably of 1 to 4 carbon atoms, acrylic acid, methacrylic acid, vinyl esters of carboxylic acids having 2 to 8 carbon atoms, e.g. vinyl acetate and vinyl propionate, acrylonitrile, methacrylonitrile, esters of maleic and/or fumaric acid, and mixtures thereof.

Preferred comonomers for preparing the polymeric binders according to the invention are styrene, methacrylic acid, acrylic acid, hydroxyalkyl (meth)acrylates, methyl methacrylate and butyl methacrylate.

Which comonomer is chosen and in what amount compared with the macromer depends on the desired properties, such as glass transition temperature and solubility in the developer medium.

If development is to take place in an aqueous alkaline medium it is necessary that the polymeric binder contain about 5-40% by weight of carboxyl-containing comonomers such as acrylic acid, methacrylic acid, maleic acid, fumaric acid or monoesters of the lastmentioned dicarboxylic acids. In addition it is advantageous to incorporate further hydrophilic monomers such as hydroxyalkyl (meth)acrylates or (meth)acrylonitrile as copolymerized units. The quantities and the mixing ratios of the comonomers used in the copolymerization depend for these copolymers on the requirements such as rapid and complete washout in an alkaline solution but very high stability to acid and neutral baths.

To ensure developability in organic solvents, such as chlorinated hydrocarbons, it is advantageous if the comonomers used are predominantly hydrophobic compounds such as styrene, esters of acrylic acid or methacrylic acid of 1 to 8 carbon atoms or vinyl esters of carboxylic acids.

Suitable solvents for solution polymerization are for example lower alcohols, e.g.. methanol, ethanol and propanol, ketones, e.g.. acetone and butanone, esters, e.g. ethyl acetate, and similar solvents and mixtures thereof.

Suitable polymerization initiators are the customary free radical starters, for example azobisisobutyronitrile, benzoyl peroxide and the like. The polymerization temperature is in general within the range from 50° C. to 100° C.

The photopolymerizable recording layer of the photosensitive recording elements according to the invention can contain one or more copolymers of the type in question as polymeric binder In addition to the polymeric binder the photopolymerizable recording layer in general also contains one or more ethylenically unsaturated, photopolymerizable, low molecular weight compounds, one or more photopolymerization initiators, or a photopolymerization initiator system, with or without further additive and/or auxiliary substances for improving or modifying the general properties of the photosensitive recording elements and/or of the printing plates and resist patterns produced therefrom.

Suitable ethylenically unsaturated, photopolymerizable low molecular weight compounds comprise not only monomers but also ethylenically unsaturated, photopolymerizable oligomers having a molecular weight of up to about 5,000, and can be not only monofunctional but also polyfunctional; that is, have one or more photopolymerizable, ethylenic double bonds. Customarily, the photopolymerizable recording layer contains difunctional or polyfunctional ethylenically unsaturated, photopolymerizable low molecular weight compounds alone or mixed with a minor amount of monofunctional ethylenically unsaturated, photopolymerizable low molecular weight compounds. Representatives of ethylenically unsaturated, photopolymerizable low molecular weight compounds which can be present in the photopolymerizable recording layer alone or mixed with one another are in particular the derivatives of acrylic acid and methacrylic acid, in particular esters of acrylic and methacrylic acid. Examples thereof are di- and tri(meth)acrylates of di- or polyols such as ethylene glycol, diethylene glycol, triethylene glycol, polyethylene glycols having a molecular weight of up to about 500, 1,2-propanediol, 1,3-propanediol, polypropylene glycols having a molecular weight of up to 500, 1,4-butanediol, 1,1,1-trimethylolpropane, 2,2-dimethylpropanediols, glycerol or pentaerythritol, pentaerythritol tetra(meth)acrylate, glucose tri- or tetra(meth)acrylate, the monoacrylates and monomethacrylates of the diols and polyols mentioned, for example ethylene glycol mono(meth)acrylate, diethylene glycol mono(meth)acrylate, triethylene glycol mono(meth)acrylate, tetraethylene glycol mono(meth)acrylate, propanediol mono(meth)acrylate and butanediol mono(meth)acrylate, and also the (meth)acrylates of monoalkanols, in particular those of monoalkanols having 1 to 20 carbon atoms. Further possibilities for use as ethylenically unsaturated photopolymerizable low molecular weight compounds are the monomeric and oligomeric urethane acrylates and methacrylates having two or more acryloyl or methacryloyl groups in the molecule. These monomeric or oligomeric urethane (meth)acrylates, which, in addition to the acryloyl and/or methacryloyl groups, may also contain free carboxyl groups, are obtainable in a conventional manner, for example by reaction of diols or polyols of the aforementioned kind with di- or polyisocyanates, for example hexamethylene diisocyanate, isophorone diisocyanate or the like, to form a reaction product having free isocyanate groups, and reaction of these isocyanate groups with, for example, hydroxyalkyl (meth)acrylates. It is also possible first to react the hydroxyalkyl (meth)acrylates with the di- or polyisocyanates and subsequently to react the resulting unsaturated isocyanate with the diol or polyol component. To introduce free carboxyl groups into the urethane compounds, some of the hydroxyl groups on the diol or preferably polyol component can be reacted with multiple carboxylic acids or, in particular, cyclic dicarboxylic anhydrides to form the acidic partial esters of the carboxylic acids. Suitable ethylenically unsaturated, photopolymerizable low molecular weight compounds for photosensitive recording elements according to the invention also include the acryloyl- and/or methacryloyl-containing compounds as obtained by reacting acrylic and/or methacrylic acid with di- or polyepoxy compounds.

Aside from the preferred acrylates and methacrylates, in particular of the aforementioned kind, the list of suitable ethylenically unsaturated photopolymerizable low molecular weight compounds also includes the allyl compounds and other vinyl compounds, for example N-vinylpyrrolidone, N-vinylcaprolactam, vinyl acetate, vinyl propionate, (meth)acrylamide, N-methylol(meth)acrylamide, the bisethers of ethylene glycol and of N-methylol(meth) acrylamide, vinyl carbamates, bisacrylamidoacetic acid and the like.

It will be readily understood by those skilled in the art that the ethylenically unsaturated, photopolymerizable low molecular weight compounds are of course chosen as to be compatible with the copolymers used as polymeric binders. The ratio of the amount of polymeric binder to the amount of ethylenically unsaturated, photopolymerizable low molecular weight compounds in the photopolymerizable recording layer can vary within wide limits, for example within the range from 10:90 to 90:10, and in general is in particular within the range from 40:60 to 90:10. The amount of polymeric binder and of ethylenically unsaturated, photopolymerizable low molecular weight compounds in the photopolymerizable recording layer depends in particular on the range of properties desired from the photosensitive recording elements and/or from the printing plates or resist patterns produced therefrom, as well as the nature of these compounds. In general, this ratio is chosen in such a way that the photopolymerizable recording layer is solid at room temperature. This applies in particular to the use of the photosensitive recording material according to the invention as a photoresist film. As for the rest, the criteria for selecting the ratio of polymeric binder to ethylenically unsaturated, photopolymerizable low molecular weight compound as a function of the nature of these compounds are familiar to those skilled in the art.

Suitable photopolymerization initiators for the photopolymerizable recording layers are the photoinitiators and photoinitiator systems which are customary in the art for photosensitive, photopolymerizable recording materials. Specific examples are: benzoin, benzoin ethers, in particular benzoin alkyl ethers, substituted benzoins, alkyl ethers of substituted benzoins, for example α-methyl benzoin alkyl ethers and α-hydroxymethyl benzoin alkyl ethers, benzils, benzil ketals, in particular benzil dimethyl ketal, benzil methyl ethyl ketal and benzil methyl benzyl ketal, the acylphosphine oxide compounds which are useful as photoinitiators, for example substituted benzoyldiarylphosphine oxides, benzophenone, derivatives of benzophenone, 4,4'-dimethylaminobenzophenone, 4,4'-diethylaminobenzophenone, derivatives of Michler's ketone, anthraquinone and substituted anthraquinones, aryl-substituted imidazoles or derivatives thereof, for example 2,4,5-triarylimidazole dimers, 2-chlorothiaxanthone, and the acridine or phenacine derivatives useful as photoinitiators. Examples of initiator systems are combinations of the initiators mentioned with sensitizing aids or activators, in particular tertiary amines. Typical examples of such initiator systems are combinations of benzophenone or benzophenone derivatives with tertiary amines, such as triethanolamine or Michler's ketone, or mixtures of 2,4,5-triarylimidazole dimers and 2-mercaptobenzoquinazole or the leuco bases of triphenylmethane dyes. The selection of suitable photoinitiators or photoinitiator systems is familiar to those skilled in the art. The photoinitiators and photoinitiator systems are present in the photopolymerizable recording layer in general in amounts of from 0.001 to 10% by weight, in particular in amounts of from 0.05 to 5% by weight, based on the photopolymerizable recording layer.

Examples of further additive and/or auxiliary substances which can be present in the photopolymerizable recording layer of the photosensitive recording elements according to the invention are thermal polymerization inhibitors, dyes and/or pigments, photochromic compounds or systems, sensitometric regulants, plasticizers, flow control aids, fillers, reinforcing agents, delusterants, lubricants and the like. Suitable thermal polymerization inhibitors are for example hydroquinone, hydroquinone derivatives, 2,6-di-t-butyl-p-cresol, nitrophenols, N-nitrosamines, such as N-nitrosodiphenylamine or the salts of N-nitrosocyclohexylhydroxylamine. Examples of dyes and/or pigments which not only can act as contrast medium but also have a layer-consolidating effect are, inter alia, Brilliant Green Dye (C.I. 42,040), Victoria Reinblau FGA, Victoria Reinblau BO (C.I. 42,595), malachite green, crystal violet, Victoria-Blau B (C.I. 44,045), Rodamin-6 (C.I. 45,160), naphthalimide dyes, azosols and 3'-phenyl-7-dimethylamino-2,2'-spirodi(2H-1-benzopyran). Photochromic systems which, on exposure to actinic light, change their color reversibly or irreversibly without thereby interfering with the photopolymerization process are for example leuco dyes together with suitable activators. Examples of leuco dyes are the lecuo bases of triphenylmethane dyes, such as crystal violet leuco base and malachite green leuco base, leuco basic blue, leuco pararosaniline and leuco patent blue A and V; Rodamin B base also comes into consideration. Suitable activators for these photochromic compounds are inter alia organic halogen compounds, which, on irradiation with actinic light, split off halogen radicals, and hexaarylbisimidazoles. Sensitometric regulants include compounds such as, for example, 9-nitroanthracene, 10,10'-bisanthrone, phenazinium, phenoxazinium, acridinium or phenothiazinium dyes, in particular combined with mild reducing agents, 1,3-dinitrobenzenes and the like. Possible plasticizers are the conventional low or high molecular weight esters, such as phthalates or adipates, toluenesulfonamide or tricresyl phosphate. The additives and/or auxiliary substances are present in the photopolymerizable recording layer in the active amounts customary for these additives. However, their amount should not in general exceed 30% by weight, preferably 20% by weight, based on the photopolymerizable recording layer.

The mixing ratio in which the individual components are present in the photopolymerizable recording layer is in general chosen in such a way that the recording layer not only is developable with organic or aqueous alkaline developers but also is advantageously solid even at room temperature and has good film formation properties. In addition, for use as a photoresist film the composition is chosen in such a way that the photopolymerizable recording layer is readily laminable and transferable to a substrate by applying pressure and, if necessary, heat. The thickness of the photopolymerizable recording layer depends as is known to those skilled in the art on the purpose for which the photosensitive recording element is intended and, accordingly, can vary within wide limits. For the production of resist patterns the thickness is in general within the range from about 1 to 50 μm, while for the production of letterpress printing plates it can range for example from about 100 μm to a few mm.

In a typical embodiment of the invention, the photopolymerizable recording layer of the photosensitive recording element comprises for example a homogeneous, film-forming mixture, which is soluble or at least dispersible in aqueous alkaline developer solutions, of
a) from 40 to 90% by weight of one or more filmforming copolymers of the aforementioned kind which have a multiphase morphology, as polymeric binder,
b) from 8 to 55% by weight of one or more ethylenically unsaturated, photopolymerizable low molecular weight compounds having 2 or more polymerizable double bonds or a mixture thereof with a minor amount of ethylenically unsaturated, photopolymerizable low molecular weight compounds having only one photopolymerizable double bond, it being a requirement that the ethylenically unsaturated, photopolymerizable low molecular weight compound should be compatible with the polymeric binder, c) from 0.001 to 10% by weight of one or more polymerization initiators or of a photopolymerization initiator system, and d) from 0 to 30% by weight, in particular from 0.05 to 20% by weight, of further additive and/or auxiliary substances which improve and/or modify the general properties of the photosensitive recording element and/or of the printing plates or resist patterns produced therefrom.

Suitable base materials for the photopolymerizable recording layers are the dimensionally stable, rigid or preferably flexible base materials which are customary for photosensitive recording elements of the type in question, which type of base material is chosen also depending upon the intended use of the photosensitive recording element. For instance, suitable dimensionally stable base materials for the production of printing plates are in particular plastics films or sheets, for example polyester sheets, and also metallic base materials, for example steel or aluminum sheets. Suitable support materials for photoresist films and laminating materials are preferably plastics films or sheets, for example polyester sheets, which have a moderate adhesion to the photopolymerizable recording layer and which, after the photopolymerizable recording layer has been laminated to a substrate, can be peeled off, facultatively before or after imagewise exposure to actinic light. To produce resist patterns, the photopolymerizable recording layer can also be applied direct to the substrate to be protected (and if required permanently modified), which then serves as a base material for the photopolymerizable recording layer. Examples of substrates for photoresist layers are copper sheets, copper-clad base materials, ceramic substrates coated with metallic or metal oxide layers, semiconductor elements, silicon wafers and the like. The support materials for the photopolymerizable recording layer may have been pretreated in a conventional manner, for example mechanically, chemically, electrochemically and/or by coating with an adhesive. It is similarly possible for one or more interlayers to be arranged between the photopolymerizable recording layer and the base material. In photosensitive recording elements for producing printing plates, for example, these interlayers can be constructed as adhesion-promoting and/or antihalation layers.

Similarly, the base remote surface of the photopolymerizable recording layer can additionally be coated or covered with a cover layer or sheet which is preferably soluble in the same developer solution as the photopolymerizable recording layer or can be peeled off before development. This cover layer or sheet serves in particular to protect the photopolymerizable recording layer in storage and handling of the photosensitive recording materials and also as an oxygen barrier for the photopolymerizable recording layer. Particularly suitable cover layers are made for example of polyvinyl alcohols or polyvinyl alcohol derivatives, and, in particular for photoresist films, cover sheets are made of polyolefins, for example polyethylene or polypropylene.

The production of the photosensitive recording elements according to the invention can be effected in a conventional manner by producing a homogeneous mixture of the component forming the photopolymerizable recording layer and applying this mixture in layer form to the dimensionally stable base material, which may bear an interlayer. Advantageously, the photosensitive recording elements are produced by dissolving the components of the photopolymerizable recording layer in a suitable solvent or solvent mixture and applying this solution to the base material in the desired layer thickness by casting, coating, spraying or some other known application technique. Thereafter the solvent is removed in a conventional manner and the photopolymerizable recording layer is dried. Suitable solvents for mixing the components and applying the photopolymerizable recording layer to the base material are inter alia, lower alcohols, ketones or esters, for example, methanol, acetone, methyl ethyl ketone, ethyl acetate and the like, and also mixtures thereof.

Thereafter the photopolymerizable recording layer may if desired be coated or covered with a cover layer or sheet.

The photosensitive recording elements according to the invention are advantageously suitable for producing printing plates or resist patterns in a conventional manner. To this end, the photopolymerizable recording layer, in the case of photoresist films and laminating materials after transfer of the layer to the substrate to be protected, is subjected to imagewise exposure to actinic light. Suitable sources of actinic light are those customary in the art, for example UV fluorescent tubes, high, medium or low pressure mercury lamps, superactinic fluorescent tubes, xenon pulsed lamps or even UV lasers, argon lasers and the like. The wavelength emitted by the light source should in general be within the range from 230 to 450 nm, preferably from 300 to 420 nm, and in particular be adapted to the self-absorption of the photoinitiator present in the photopolymerizable recording layer. The imagewise exposure to actinic light triggers a photopolymerization in the exposed areas of the recording layer which leads to crosslinking and hence to solubility differentiation between the exposed and the unexposed areas of the layer. After imagewise exposure the printing plate or resist pattern is developed by washing out the unexposed, uncrosslinked areas of the recording layer with an aqueous alkaline developer solution or with an organic solvent (mixture) by washing, spraying, rubbing or brushing etc. In the development step, the recording elements according to the invention show wide development latitude and minimal overwash sensitivity. Suitable aqueous alkaline developer solutions are those customary in the art which contain alkaline substances, for example borax, disodium hydrogenphosphate, sodium carbonate, alkali metal hydroxides or organic bases, such as di- or triethanolamine, in solution in water for setting the best pH, in general within the range from 8 to 14, preferably in the range from 9 to 12. The aqueous alkaline developer solutions may also contain buffer salts, for example watersoluble alkali metal phosphates, silicates, borates, acetates or benzoates. The developer solutions may further contain wetting agents, preferably of the anionic type, and possibly water-soluble polymers, for example sodium carboxymethylcellulose, polyvinyl alcohol, polysodium acrylate and the like. Aqueous alkaline developer solutions may additionally contain small amounts of water-soluble organic solvents, for example aliphatic alcohols.

Preferred organic solvent (mixture) developers are saturated chlorohydrocarbons, such as trichloroethane.

The photosensitive recording elements according to the invention are distinguished by good exposure properties and good developability, as a consequence of which reproduction is faithful and reliable, even of very fine image elements. The photopolymerizable recording layers according to the invention adhere very firmly to metallic or metal oxide substrates without residues being left behind in the washed-out areas in the development of the imagewise exposed recording layer. The photosensitive recording elements according to the invention are generally suitable for all applications in reprography and optical information fixing, in particular for producing printing plates and resist patterns and also, owing to the high flexibility and good adhesion to the base substrate, for producing soldering masks.

The invention is explained in more detail by the Examples below. Parts and percentages are by weight, unless otherwise stated.

EXAMPLE 1

A reaction vessel which is equipped with a stirrer, a reflux condenser and a nitrogen inlet tube is charged in succession with the following components:
20 parts of acrylic acid
50 parts of n-butyl acrylate
30 parts of a polystyrene monoacrylate of molecular weight 4,500
200 parts of methyl ethyl ketone
1 part of azobisisobutyronitrile (=AIBN).

The mixture is at room temperature in the course of 20 minutes of flushing with nitrogen, and the solution is subsequently refluxed for 8 hours. After cooling down, the solution is precipitated in n-hexane, and the precipitate is dried in a vacuum drying cabinet to leave a polymer which is castable from solution to give a transparent elastic and nontacky film. The polymer has two glass transition temperatures, at +30° C. and +64° C.

EXAMPLE 2

A reaction vessel equipped as for Example 1 is charged with:
20 parts of acrylic acid
20 parts of hydroxypropyl acrylate
40 parts of tetraethylene glycol monoacrylate
20 parts of a polystyrene monoacrylate of molecular weight 4,500
150 parts of methyl ethyl ketone.

The solution is heated to 80° C., and 0.5 part of AIBN is added. After 8 hours of reaction the contents are precipitated by pouring onto petroleum ether. A sample of this polymer is castable to form a nontacky, elastic, transparent film. The polymer has two glass transition temperatures: −9° C. and +55° C.

EXAMPLE 3

Example 1 is repeated to prepare a polymer from a mixture of
30 parts of n-butyl acrylate
20 parts of hydroxypropyl acrylate
20 parts of acrylic acid
20 parts of polystyrene monoacrylate of molecular weight 4,500 in
150 parts of methyl ethyl ketone.

The polymer forms a transparent, elastic, non-tacky film from solution. The glass transition temperatures are −15° C. and +49° C.

EXAMPLE 4

Example 1 is repeated to prepare a polymer from
40 parts of n-butyl acrylate
23 parts of hydroxypropyl acrylate
20 parts of acrylic acid and
20 parts of a copolymer of 84% styrene and 16% of methacrylic acid having an acrylate end group and a molecular weight of about 5,000 in
150 parts of methyl ethyl ketone.

The polymer obtained is castable from solution to give a transparent, elastic and nontacky film.

EXAMPLE 5

Example 1 was repeated to prepare from
70 parts of n-lauryl acrylate and
30 parts of a polystyrene monoacrylate of molecular weight 13,000
a polymer which has two glass transition temperatures (−64° C./+54° C.) and forms a nontacky, transparent, elastic film solution.

EXAMPLE 6

A polymeric binder is prepared from:
32 parts of poly-2,6-dimethylphenylene oxide monoacrylate having a molecular weight of 7,500
30 parts of hydroxypropyl acrylate and
38 parts of n-butylacrylate.

The polymer is transparent, film-forming and elastic.

EXAMPLE 7

Example 1 is repeated to prepare a polymeric binder from
16 parts of poly-2,6-dimethylphenylene oxide monoacrylate having a molecular weight of about 15,000
29 parts of hydroxypropyl acrylate and
55 parts of n-butyl acrylate.

The glass transition temperatures are found to be −40° C. and +90° C.

COMPARATIVE EXAMPLE 1

Example 1 was repeated, except that the macromer was replaced by styrene. The result obtained was a brittle, rigid, nonelastic polymer having a single glass transition temperature of 53° C.

EXAMPLE 8

A polymeric binder was prepared by a procedure analogous to that of Example 1 from
20 parts of acrylic acid
60 parts of n-butyl acrylate and
20 parts of a polystyrene monoacrylate having a molecular weight of 4,500.

The polymer obtained has two glass transition temperatures (+12° C./62° C.) and is castable into a transparent elastic film.

COMPARATIVE EXAMPLE 2

Example 8 was repeated, except that the macromer is replaced by styrene. The result obtained is a polymer having a single glass transition temperature of +27° C. A film cast from solution is tacky and shows substantial plastic flow.

EXAMPLE 9

A procedure analogous to that of Example 1 is used to prepare a polymeric binder from
25.6 parts of n-butyl acrylate
2.8 parts of acrylic acid
39.6 parts of methyl polyglycol acrylate and
32 parts of a polystyrene monoacrylate having a molecular weight of 13,000.

The polymer obtained has two glass transition temperatures (8° C./85° C.) and forms a transparent, elastic cast film.

EXAMPLE 10

A solution of
60 parts of the binder of Example 2,
16.8 parts of hexanediol acrylate
20 parts of blocked isopherone diisocyanate
3 parts of benzophenone and
0.07 part of Michler's ketone in
150 parts of methyl ethyl ketone
is cast with the aid of a laboratory caster onto a polyethylene terephthalate sheet and dried at 80° C. in a through circulation cabinet, so that the result is an elastic, transparent layer 75 µm in thickness which can be applied with a commercial laminator to a printed circuit. This layer is exposed through a negative, and the unexposed areas are washed out with a 1% strength sodium carbonate solution. The circuit is subsequently cured at 150° C. for 1 hour. The result is a film of excellent adhesion and good flexibility.

EXAMPLE 11

A solution is prepared from
66.6 parts of the binder of Example 3
30 parts of a reaction product of butanediol diglycidyl ether with methacrylic acid
3.4 parts of benzophenone and
0.13 part of Michler's ketone.

A film is cast as in Example 10 in a dry thickness of 35 µm. This transparent, elastic film is laminated onto a flexible base material comprising a copper-clad polyimide sheet and is exposed through a negative. Developing in 1% strength sodium carbonate solution leaves a circuit diagram on the layer which, even on flexing the substrate, does not break or spall. Thereafter the copper can be etched away in a commercial etching solution. The resist layer is subsequently removed in 3% strength potassium hydroxide solution at 50° C.

EXAMPLE 12

Example 10 is repeated to prepare a film from a mixture comprising
76.6 parts of the binder of Example 4
20.0 parts of trimethylolpropane triacrylate
3.4 parts of benzophenone and
0.13 part of Michler's ketone.

A nontacky, elastic, transparent layer is obtained. After exposure through a negative the unexposed areas can be developed with trichloroethane and the circuit diagram tin-plated in a commercial electroplating bath. Removing the layer with methylene chloride and etching the copper gives a circuit of high quality.

EXAMPLE 13

A 75 µm thick layer is prepared from a mixture comprising
56 parts of the binder of Example 4,
21 parts of the reaction product of butanediol diglycidyl ether with methacrylic acid,
20 parts of blocked isophorone diisocyanate
3 parts of benzophenone and
0.07 part of Michler's ketone.

The result obtained is a transparent, elastic layer which can be processed as in Example 12, affording a soldering mask of high quality.

EXAMPLE 14

A Brabender Plastograph was used to knead the following components at 120° C. for 30 minutes:
88.5 parts of the binder of Example 9
4.87 parts of glycidyl methacrylate
0.03 part of dimethylaminopyridine
0.2 part of 2,6-di-(tert-butyl)cresol
5 parts of tetraethylene glycol dimethacrylate
1 part of benzil dimethyl ketal
0.4 part of the potassium salt of $N^2$-hydroxy-$N^1$-cyclohexyldiazenium oxide.

The homogeneous mixture is pressed by means of a hydraulic press onto a 240 µm thick steel sheet having a 5 µm thick adhesion-promoting layer in such a way as to give a layer thickness of 640 µm. After a 9 µm thick polyester sheet has been laminated on, the mixture is exposed through a negative for 20 minutes. Thereafter the polyester sheet is removed, and the exposed layer is developed in 0.5% strength sodium hydroxide solution for 15 minutes using a brush washer. Drying gives a plate which corresponds to the transparent areas of the negative. This flexible letterpress plate has a nontacky surface and produces very good printed copies even on repeated use.

We claim:

1. A photosensitive recording element useful in the production of a printing plate or a resist pattern comprising a dimensionally stable base and a photopolymerizable recording layer on said base, said photopolymerizable recording layer being developable with aqueous alkali or with organic solvents and containing a polymeric binder which is soluble or dispersible in aqueous alkaline media or in organic solvents, one or more low molecular weight ethylenically unsaturated photopolymerizable organic compounds and one or more free radical forming photopolymerization initiators with or without further additive and/or auxiliary substances, wherein the polymeric binder comprises one or more film-forming copolymers which have a multiphase morphology with one or more phases having a glass transition temperature below room temperature and one or more further phases having a glass transition temperature above room temperature, this or these copolymers having been obtained by free radical copolymerization of one or more macromonomers with one or more further olefinically unsaturated copolymerizable organic compounds, and wherein, in the multiphase morphology copolymer used as the polymeric binder, the continuous phase has a glass transition temperature below room temperature and the dispersed phase has a glass transition temperature above room temperature.

2. The photosensitive recording element useful in the production of a printing plate or resist pattern of claim 1, wherein the polymeric binder comprises a filmforming copolymer which has a two-phase morphology.

3. The photosensitive recording element useful in the production of a printing plate or resist pattern of claim 1, wherein the polymeric binder has an average molecular weight (weight average) of over 10,000.

4. The photosensitive recording element useful in the production of a printing plate or resist pattern of claim 2, wherein the polymeric binder has an average molecular weight (weight average) of over 10,000.

5. The photosensitive recording element useful in the production of a printing plate or resist pattern of claim 1, wherein the macromer used for preparing the copolymer used as polymeric binder has an average molecular weight (weight average) from 1,000 to 100,000.

6. The photosensitive recording element useful in the production of a printing plate or resist pattern of claim 2, wherein the macromer used for preparing the copolymer used as polymeric binder has an average molecular weight (weight average) from 1,000 to 100,000.

7. The photosensitive recording element useful in the production of a printing plate or resist pattern of claim 3, wherein the macromer used for preparing the copolymer used as polymeric binder has an average molecular weight (weight average) from 1,000 to 100,000.

* * * * *